US009777365B2

(12) United States Patent
Stowell, Jr. et al.

(10) Patent No.: US 9,777,365 B2
(45) Date of Patent: Oct. 3, 2017

(54) MULTI-ZONE MODULAR COATER

(71) Applicant: ITN Energy Systems, Inc., Littleton, CO (US)

(72) Inventors: Michael Wayne Stowell, Jr., Loveland, CO (US); Garrett Scott Kato, Arvada, CO (US)

(73) Assignee: ITN ENERGY SYSTEMS, INC., Littleton, CO (US)

( * ) Notice: Subject to any disclaimer, the term of this patent is extended or adjusted under 35 U.S.C. 154(b) by 283 days.

(21) Appl. No.: 14/360,998

(22) PCT Filed: Nov. 29, 2012

(86) PCT No.: PCT/US2012/067052
§ 371 (c)(1),
(2) Date: May 28, 2014

(87) PCT Pub. No.: WO2013/082279
PCT Pub. Date: Jun. 6, 2013

(65) Prior Publication Data
US 2014/0318452 A1 Oct. 30, 2014

Related U.S. Application Data

(60) Provisional application No. 61/564,728, filed on Nov. 29, 2011, provisional application No. 61/635,748, filed on Apr. 19, 2012.

(51) Int. Cl.
*C23C 14/56* (2006.01)
*C23C 14/54* (2006.01)
(Continued)

(52) U.S. Cl.
CPC ............ *C23C 14/56* (2013.01); *B05D 3/0486* (2013.01); *C23C 14/54* (2013.01); *C23C 14/562* (2013.01);
(Continued)

(58) Field of Classification Search
None
See application file for complete search history.

(56) References Cited

U.S. PATENT DOCUMENTS 4,842,893 A    6/1989  Yializis et al.
5,192,585 A *  3/1993  Inokuti .................. C21D 9/565
                                                         118/50
(Continued)

FOREIGN PATENT DOCUMENTS

WO    WO 2011/028119    3/2011

OTHER PUBLICATIONS

International Search Report and Written Opinion for International Application No. PCT/US2012/067052 mailed Feb. 15, 2013.
(Continued)

*Primary Examiner* — Dah-Wei D Yuan
*Assistant Examiner* — Jethro M Pence

(57) ABSTRACT

This disclosure describes a module web coating system and components thereof including a more uniform atmospheric control pumping mechanism and gas curtain separation system. A modular web coating system may include an unwind module, any number of process modules, and a rewind module. The process modules are interchangeable and independently operable. In addition, this disclosure describes a more uniform pumping system in which process gas is removed from multiple locations or slits spaced around a process chamber and, in an example, around a process device such as a deposition source. The gas curtain system utilizes a zone between process chambers into which separation gas is injected. Gas from the chambers is continuously removed thereby operating the chambers under negative pressure and preventing process gas from one chamber bleeding into an adjacent chamber.

8 Claims, 10 Drawing Sheets

(51) Int. Cl.
*B05D 3/04* (2006.01)
*B05D 1/00* (2006.01)

(52) U.S. Cl.
CPC ............ *B05D 1/60* (2013.01); *B05D 2201/00* (2013.01); *B05D 2202/00* (2013.01); *B05D 2252/02* (2013.01); *B05D 2252/10* (2013.01)

(56) References Cited

U.S. PATENT DOCUMENTS

| | | |
|---|---|---|
| 5,877,895 A | 3/1999 | Shaw et al. |
| 6,392,387 B1 | 5/2002 | Sage et al. |
| 6,515,787 B1 | 2/2003 | Westfall et al. |
| 6,822,778 B2 | 11/2004 | Westfall et al. |
| 6,856,444 B2 | 2/2005 | Ingalls et al. |
| 7,009,750 B1 | 3/2006 | Westfall et al. |
| 7,126,091 B1 | 10/2006 | Westfall et al. |
| 7,133,181 B2 | 11/2006 | Greer |
| 7,145,709 B1 | 12/2006 | Westfall et al. |
| 7,215,457 B1 | 5/2007 | Westfall et al. |
| 7,265,890 B1 | 9/2007 | Demiryont |
| 7,265,891 B1 | 9/2007 | Demiryont |
| 7,277,215 B2 | 10/2007 | Greer |
| 7,372,610 B2 | 5/2008 | Burdis et al. |
| 7,531,239 B2 | 5/2009 | Demiryont |
| 7,586,667 B2 | 9/2009 | Demiryont |
| 7,593,154 B2 | 9/2009 | Burdis et al. |
| 7,619,804 B1 | 11/2009 | Demiryont |
| 7,704,555 B2 | 4/2010 | Demiryont |
| 7,830,585 B2 | 11/2010 | Widjaja et al. |
| 2004/0026374 A1 | 2/2004 | Nguyen et al. |
| 2009/0196997 A1 | 8/2009 | Nakagame et al. |
| 2010/0209614 A1 | 8/2010 | Sakata et al. |
| 2011/0070375 A1 | 3/2011 | Herzog et al. |
| 2011/0272787 A1 | 11/2011 | Eser et al. |

OTHER PUBLICATIONS

Electric Power Research Institute, Development of Flexible Electrochromic Films, 1018525, Technical Update, Dec. 2009, EPRI Project Manager: K.R. Amarnath, 2009, 42 pgs.

\* cited by examiner

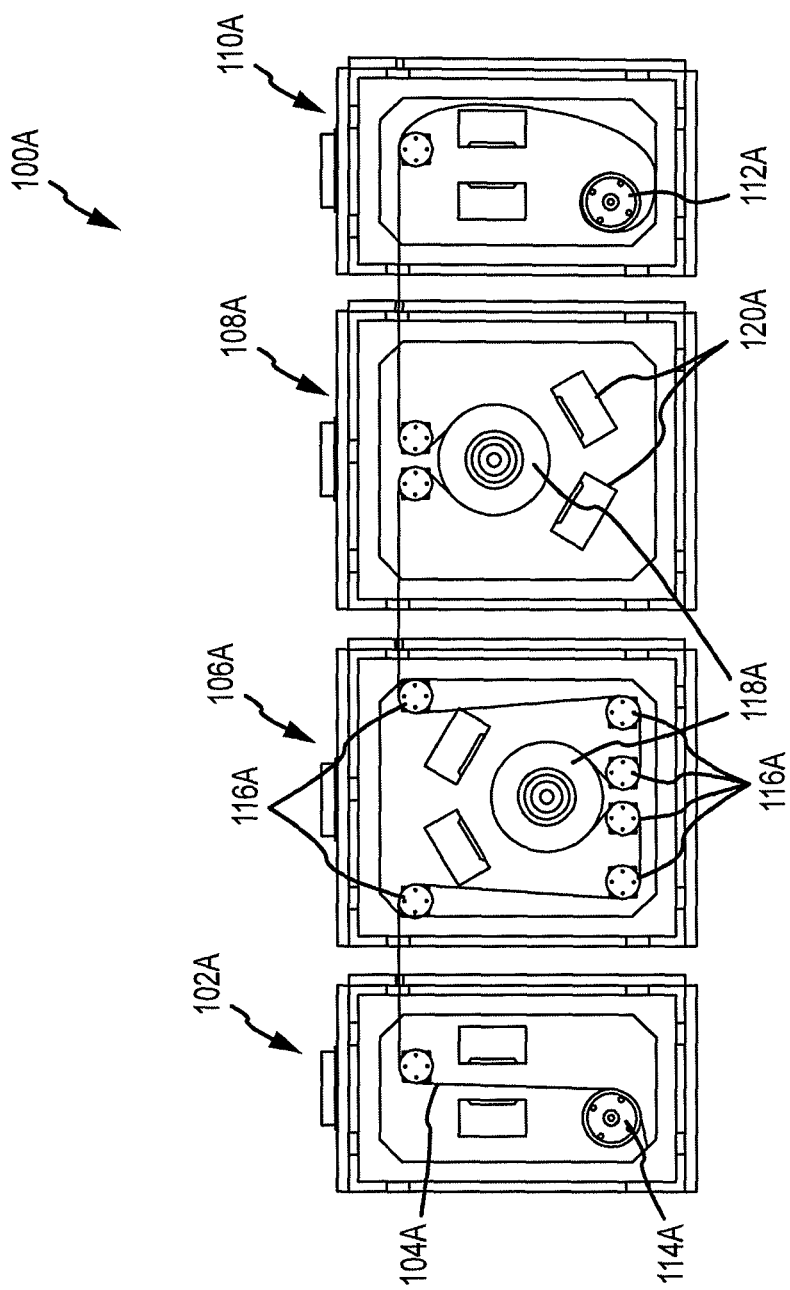

MULTI-ZONE MODULAR COATER

This application is a National Stage Application of PCT/US2012/067052, filed 29 Nov. 2012, which claims priority to U.S. Provisional Patent Application No. 61/564,728, filed Nov. 29, 2011 and U.S. Provisional Patent Application No. 61/635,748, filed Apr. 19, 2012, the disclosures of which are hereby incorporated by reference herein in their entireties. To the extent appropriate, a claim of priority is made to each of the above disclosed applications.

INTRODUCTION

Thin film materials are used in a variety of different applications. In some applications, thin film materials are deposited onto flexible substrates, such as polymeric or metallic substrates, referred to herein as the substrate or "web." For example, in some solar applications, photovoltaic materials are deposited onto flexible substrates for use on rooftops, in mobile solar devices, and other applications. In addition to photovoltaics, other thin films are deposited onto flexible substrates for use in batteries, electrochromics, and other flexible electronics. Thin film materials are used in a variety of applications such as photovoltaic cells or semiconductor fabrication.

Current systems and processes for depositing thin film lack modularity. This lack of modularity causes certain process problems. For example, in certain applications there is a need to deposit on both sides of the web substrate. Current systems require multistep batch processing to deposit thin films on both sides of a web. Typically, one side of the web substrate is processed first. The web substrate is then removed from the system and reoriented such that the opposite side can then be processed. This step not only takes time, but the web must be removed from the system. This may cause exposure to air. Such actions may cause a variety of deleterious results including oxidation of the web. This may result in the finished product having different material properties than intended.

Current systems and processes for depositing thin film also lack the ability to optimize process conditions. Temperature is one of these process conditions. Current systems and processes may need to control temperature when depositing thin film materials onto a flexible substrate. These systems and methods may use a drum or a free span deposition chamber to deposit the thin film materials. When using a drum, the temperature of the drum may not be hot or cold enough to effectively heat or cool the flexible substrate. When using a free span deposition chamber, precise temperature control is a problem.

Additionally, current systems and methods fail to adequately control gas pressure and flow in process chambers. Certain applications require pressure control. Current systems may have a single pump for gas delivery and evacuation. These pumping schemes, and others like them, cause non-optimal pressure and flow rate differential within the system. For example, horizontal and vertical pressure may be unbalanced because of current pumping schemes.

Moreover, some multiple chamber processes fail to adequately regulate gas mixing. Specific partial pressures of gaseous mixtures may be necessary for certain applications. Current multiple chamber processes may disturb the homogeneity of these partial pressures within a system. This effect is exacerbated when an individual chamber requires a different gaseous mixture than other chambers.

It is with respect to these and other considerations that embodiments have been made. Also, although relatively specific problems have been discussed, it should be understood that the embodiments should not be limited to solving the specific problems identified in the background.

Multi-Zone Modular Coater

This disclosure describes a module web coating system and components thereof including a more uniform atmospheric control pumping mechanism and gas curtain separation system. A modular web coating system may include an unwind module, any number of process modules, and a rewind module. The process modules are interchangeable and independently operable. In addition, this disclosure describes a more uniform pumping system in which process gas is removed from multiple locations or slits spaced around a process chamber and, in an example, around a process device such as a sputtering cathode or similar deposition source. The gas curtain system utilizes a zone between process chambers into which separation gas is injected. Gas from the chambers is continuously removed. This operates the chambers under negative pressure and prevents the process gas of one chamber, potentially containing trace airborne materials, from bleeding into and contaminating an adjacent chamber.

In one aspect, the present disclosure describes a multi-zone modular coating system that includes two or more independently controllable modules mechanically coupled together, wherein one of the two or more modules is one of: an unwind module, a rewind module, a deposition module, a thermal evaporation module, or a differential pumped isolation module. One or more of the modules may include a camel hump and/or a radiant roller, as described further below. One or more of the modules may be further provided with an open slit chamber wall and an integrated linear inter-cell and background pumping configuration. The system may further include a multiple chamber module having at least a first web processing chamber and a second web processing chamber, in which each web processing chamber including a process gas transport system through which process gas is removed from or injected into the chamber. The system may also include a multiple-chamber gas curtain separation system configured to pump curtain gas into a zone between and in fluid communication with the first chamber and the second chamber, wherein the gas curtain separation system, if necessary, removes mixed process and curtain gas from the zone and maintains the pressure of process gas in the zone at a level lower or higher than process gas pressures in the first and second chambers, thereby preventing transport of process gas between the first chamber and the second chamber.

In another aspect, the disclosure describes a gas curtain system for use with a coater that includes a drum for moving a web; at least a first web processing chamber and a second web processing chamber, each web processing chamber adjacent to the drum and adapted to perform a process on a surface of the web, each web processing chamber including a process gas transport system through which a flow of process gas is injected into the chamber; an interstitial space between and in fluid communication with the first and second web processing chambers; one or more curtain gas injection ports through which a flow of curtain gas is injected directly into the interstitial space; and a gas removal system that removes the curtain gas injected into the interstitial space and at least a portion of the process gases injected into the first and second web processing chambers. The gas curtain system may further include a curtain gas injection system that injects the curtain gas into the interstitial space through the curtain gas injection ports and a control system that monitors the pressures in the interstitial space and the first and second web processing chambers and controls the operation of one or more of the gas removal system, in which the curtain gas injection system and the process gas transport system. In an embodiment of the gas curtain system the control system controls the flow of at least one of the curtain gas and the process gases to maintain a pressure in the interstitial space below process gas pressures in the first and second web processing chambers. The curtain gas, the process gas injected into the first web processing chamber, and the process gas injected into the second web processing chamber may be the same or different gases. In the gas curtain system, the first web processing chamber may include at least one cathode body and a plurality of linear openings adjacent to and spaced about the cathode body and the process gas flow injected into the first web processing chamber may be at least partially injected through the linear openings so that the process gas flow is distributed around the cathode body. The linear openings may be integrated into the cathode body. A process gas transport chamber may be provided that is in fluid connection with the plurality of linear openings and a pumping system that pumps process gas into the process gas transport chamber, thereby injecting process gas into the first web processing chamber through the plurality of linear openings, may be used.

In yet another aspect, this disclosure describes a drum coater system for processing a web. The drum coater system includes a rotatable drum having an exterior drum surface adapted to engage a web; a camel hump adjacent to the rotatable drum, the camel hump being a non-moving body having a drum-facing surface adjacent to the exterior drum surface and a web contact surface spaced facing away from the exterior drum surface adapted so that a web on the rotating drum travels across the web contact surface during drum rotation. In the drum coater system, the temperature of the rotatable drum and the camel hump are independently controlled. In the drum coater system the camel hump and the drum may each include one or more of a resistive heating element, a thermal fluid transfer element, and a conductive transfer element. At least a portion of the camel hump may be made of an insulating material and wherein the insulating material is located adjacent to the exterior drum surface to insulate the web contact surface of the camel hump from the exterior drum surface. The drum coater system may include multiple camel humps and a control system configured to independently control the temperature of each web contact surface of each of the plurality of camel humps. Each of the camel humps may be in a different web processing chamber performing a different web processing operation at least partially affected by the temperature the web contact surface of the camel hump. The distance between the camel hump and the exterior drum surface may be fixed and the shape of the drum-facing surface is complementary to the curvature of the exterior drum surface so that the distance between the drum-facing surface and the exterior drum surface does not vary.

These and various other features as well as advantages which characterize the systems and methods described herein will be apparent from a reading of the following detailed description and a review of the associated drawings. Additional features are set forth in the description which follows, and in part will be apparent from the description, or may be learned by practice of the technology. The benefits and features of the technology will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Non-limiting and non-exhaustive embodiments are described with reference to the following figures:

FIG. 1A illustrates an embodiment of a Flexible Integrated Modular Coater Deposition System.

DETAILED DESCRIPTION

Figure 1B:
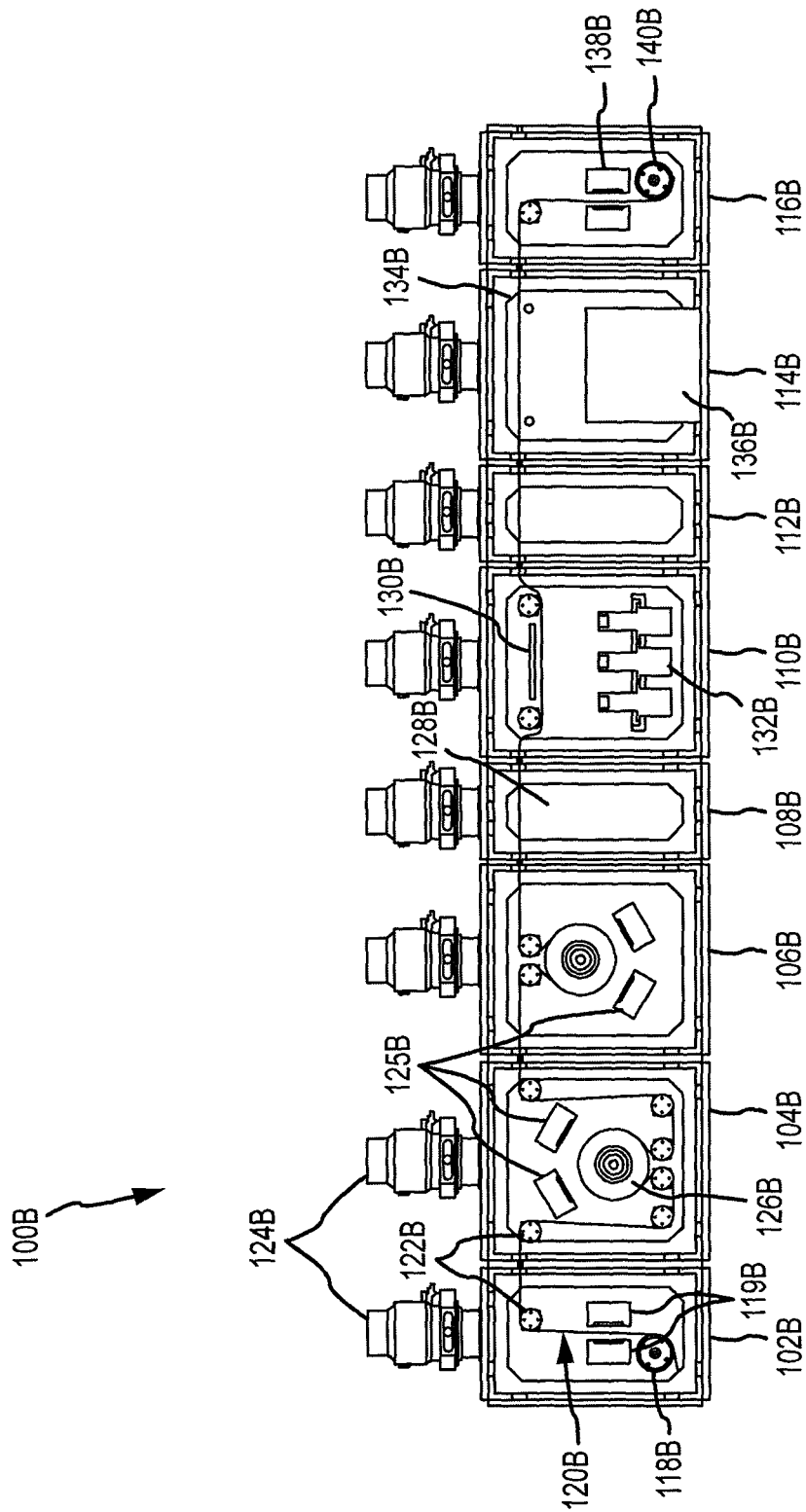
FIG. 1B illustrates an alternative embodiment of a Flexible Integrated Modular Coater Deposition System.

Various embodiments are described more fully below with reference to the accompanying drawings and attached documents, which form a part hereof, and which show specific exemplary embodiments. However, embodiments may be implemented in many different forms and should not be construed as limited to the embodiments set forth herein; rather, these embodiments are provided so that this disclosure will be thorough and complete, and will fully convey the scope of the embodiments to those skilled in the art. Embodiments may be practiced as methods, systems or devices. The following detailed description is, therefore, not to be taken in a limiting sense.

Embodiments are directed to a Flexible Integrated Modular Coater Deposition System (hereinafter the "System"). The System may be designed to apply coatings to one or both sides of a web in a single process. The embodiments of the System described herein increase material through-put while reducing downtime associated with roll change-out, target and roller replacement, routine debris removal, and system maintenance. Further, the System may be designed to facilitate control of temperature, flow rates, partial pressures, and gas separation of one or more process chambers and modules in a variety of deposition systems including but not limited to an integrated drum roll-to-roll coating system.

One embodiment of the System may be seen in FIG. 1A. The System 100A is an example of a modular design comprised of an unwind module 102A, a web 104A, a back-side deposition module 106A, a front-side deposition module 108A, and a rewind module 110A. The four modules are shown separated for illustration purposes. In a standard embodiment, however, the modules may be connected so that the web is not exposed to the external environment as it passes through the different environments of each module.

In embodiments, the System 100A may have processes and equipment to pressurize modules and chambers to the appropriate pressure. The pressure in each module may be controlled independently of the pressure in other modules. Additionally, each module may have various chambers within the module. These chambers may each be pressurized to a particular set point, and the pressure in one chamber may be independently controlled, or the pressure and temperature of the module may be maintained as a single unit. Furthermore, the pressure within each module or chamber may vary over time depending on the process requirements. Pressurizing the system may include evacuating the system, or it may include increasing the pressure in the system. Additionally, the temperature of each module or chamber within each module may be controlled. This may occur prior to, during, or after the pressurizing of each module or chamber.

One skilled in the art would appreciate that it may be desirous to create low pressure conditions within a module and within chambers of a module. This may be facilitated by using certain hardware components in combination with vacuum pump piping. For example, chamber and module walls may be fabricated from 304 or 304L stainless steel. For connections to external components and between modules, O-rings may be used such as BUNA-N, Viton or other materials as necessary for the desired applications. In embodiments, individual leaks in the System are preferably kept below $5 \times 10^{-9}$ sccm/sec.

In embodiments, a vacuum pumping system may be designed for attaining a low pressure environment. Pump piping may be welded 304 or 316L stainless steel or any other suitable material. A roughing pump may be employed at early stages to achieve very low pressures within the system. A variable speed control pump may be used. Other pump types may be used. Working pressure may be controlled by adjusting the exhaust. Working pressure may also be controlled by adjusting the pumping rate. Vacuum pump piping may use various types of flanges in order to facilitate rapid removal of the flanges. These flanges may be KF ISO style flanges. Less frequently removed flanges may be conflate style flanges.

Additionally, the System 100A may incorporate features to allow for maintenance and cleaning. Module and chamber facets may use removable plates to provide access to the interior of the modules or to remove components from the module. This may allow for major maintenance or modification.

Further, the chamber may have the ability to be heated or cooled during the processing. The chamber walls, flanges, doors, and deposition shielding may be temperature controlled. This may use a fluid heat exchanger. The fluid heater-cooler unit may use a water glycol blend.

Process gas may be distributed to the module or to individual chambers within a module. In embodiments, incoming process gas pressure may be regulated to 20 and 40 psig. Other pressure set points may be used. Pressures may be controlled using an automated PID exhaust conductance controller and mass flow controllers. In an example embodiment, control of pressure within a chamber or module may be controlled to within 0.1 torr of an absolute pressure set within the range of 2.0 to 50.0 torr. Control of process gas flow to a chamber or module may be controlled to within 0.1 sccm within a range of 0 to 200 sccm. In an embodiment, distribution systems may use Cajon VCR or similar type fittings to reduce leakage gas.

The System 100A may cause translation of the web 104A from the unwind module 102A to the rewind module 110A in a continuous motion. In this process the web 104A may pass through the back-side deposition module 106A and the front-side deposition module 108A. This may continue until a substantial amount of one or both sides of the web 102A are coated. The web system may be stopped. The deposition zones 106A and 108A may be cooled. The System 100A may be vented, and the coated web 104A may be removed from a rewind spindle 112A. In the web path there may be multiple idler rollers, sensors and load cells that keep the web aligned and tracking in a defined lateral space thru the multiple deposition chambers and modules.

Though System 100A depicts only four modules, other embodiments may have as little as one module. Still other embodiments may have greater than four modules. Further, other types of modules such as thermal evaporation modules, differential pumped isolation modules, in-situ coating diagnostic modules, in situ-process metrology module, thermal annealing modules free-span deposition modules, and temperature controlled drum deposition modules may be used in embodiments of the System. An individual module may have a single chamber or it may have multiple chambers. Each module may contain multiple chambers, and this may be referred to as a multiple chamber module.

In embodiments, module interfaces are typically high vacuum seal interface designed to mechanically couple together. An o-ring groove may be present on one or more interfaces of the module interfaces. An o-ring may be fitted into the o-ring grove. An adjacent module may have a flat mat surface. The o-ring interface may be mechanically coupled to the flat-mat surface using external or internal mounting hardware. Translation of the web may pass through a flange, a hole, or other opening. These openings may have a hi-vacuum seal around the perimeter.

The unwind module 102A may give the System 100A the ability to clean or prepare the web surface prior to coating. The web cleaning or surface modification may be done to a web prior to deposition. A plasma unit, an ion beam, or electron beam unit may be used to modify the web surface. Resistive or infra-red heaters may also be used in combination to clean or degas some web materials.

The unwind module 102A may have a mandrel 114A on which the web 104A may be spooled or a removable web spool may be attached. For example, a fully spooled mandrel may have 20" O.D. with a 6" core by 1.2 meter wide, and the fully spooled web may weigh 1500 lbs. The System 100A may include elements that shield roller bearings from deposition. The mandrel may be shielded to prevent deposition of sputtered material. Additionally, an unwind module 102A may have the ability to process different types, widths and thicknesses of webs. For example, an unwind module 102A, as well as the other modules, may have the components necessary to handle 1.0 meter, 1.2 meter and other widths of webs with a minimum of reconfiguration. This may allow the System to be quickly adapted to different widths and applications.

As the web 104A is translated through the System 100A, idler rollers 116A in various modules may guide the web 104A through the modules. Idler rollers may be designed for removal for periodic cleaning. In embodiments, the idler roller surface roughness may be 8 microinch rms. Idler rollers may spin freely, and they may have low rotational inertia. Idler rollers may be shielded to prevent deposition of sputtered material. Idler rollers may have active sensors to indicate positive motion.

The web 104A may translate through the system at specified rate. The System 100A may translate the web at a rate of 12 to 48 web-inches per minute. This speed may be set to be constant during processing or may vary as needed. A high speed web-wrapping phase may allow for wrapping at a greater speed than that of the processing speed. Acceleration and deceleration may be controlled. This may prevent slack in the spool. The web 104A may have a tension of 10-50 lbf for a 1 meter wide web. In an embodiment in which different processes require different residence times, in order to run the System at a single speed, modules may vary in length or additionally modules may be added.

In the embodiment shown in FIG. 1A, one module 106A of System 100A is a back-side deposition module 106A. The web 104A may be routed through the back-side deposition module 106A so that the back-side of the web 104A faces a deposition source or other processing device. The module 106A is shown with six idler rollers 116A for receiving and directing the web 104A onto a drum 118A and through the module so that the back side of the web is exposed to two processing devices 120A, e.g., magnetron sputtering cathodes, thermal evaporation source, ION beam or electron beam source, etc.

The web 104A continues through the system from the back-side deposition module 106A to the front-side deposition module 108A. The translation of the web 104A through the front-side deposition module 108A occurs in such a way that the front-side of the web substrate is exposed to the output of two depositions sources 120A. Both the back-side deposition module 106A and the front-side deposition module 108A may include one or more of the following: a drum, an idler roller, a camel hump, a radiant roller, a free span, an additional transport device, and any processing devices such as a deposition source, a heater, a laser or an optical device, a process monitor or process sensors, etc., as necessary for the desired final product. In embodiments the System, sputtering techniques utilized may include ion-beam, ion-assisted, high-target-utilization reactive deposition, high-power impulse magnetron, gas flow deposition or any deposition technology now known or later developed. A web 102A passing in proximity to a deposition cathode and target plate may cause material to be deposited onto the side exposed to the plate.

Cathodes may be employed in the back-side deposition module 106A and the front-side deposition module 108A. Power to the cathode may be supplied by radio frequency ("RF"). RF power supplies may have the capability for phase locking to avoid RF cross-talk by using one power supply as the master and by disabling the RF signal generator in the remaining power supplies. Safety systems may be provided to shut off power to the cathodes if protective covers are removed or errors are detected.

Cathodes may be cooled in various ways. In embodiments, the cathodes may be cooled directly. Cooling water or other cooling fluid may directly contact the deposition material's backing plate. Indirect cooling may use a cooling system that does not require direct contact with the deposition material's backing plate.

Deposition modules 106A and 108A may be designed for easy maintenance and cleaning. For example, a target plate may be removable and replaceable without requiring the modules in the System to be detached from each other. The interior may be cleaned with the cathodes mounted to the chamber frame. The chamber frame may be designed for insertion of the cathode mounting plate removal tool.

Direct cooling may affect maintenance of the cathode. Replacing the target may be necessary. It may be advantageous to remove the cooling water or other cooling fluid from inside the cathode body. Doing so while the cathode is in the process chamber may expose the process chamber to water. Consequently, it may be advantageous to remove the cathode from the module before servicing the cathode.

Indirect cooling may not require the cooling water or other cooling fluid to be removed. Thus, the target may be changed at or within the deposition module. Valving may be used to isolate the cathodes from the rest of the System 100. This may allow for the cathode to be serviced without a total system vent.

A drum, idler roller, camel hump or radiant roller may be used to heat or cool the web 104A. In embodiments of the System, any drum, idler roller, camel hump (as described in greater detail below) or radiant roller may be temperature controlled independent of the temperature of the gas environment in the interior space of the modules. The temperature control of components that physically contact the web may include the use of radio frequency, alternating current, or pulsed direct current. Additionally, plasma may be used to add energy to the System where needed. The use of magnetics in the localized drum, idler roller, camel hump or radiant roller may be used to increase the sputtered species ionization fraction and surface energy in the web. The temperature control may use a programmable logic controller ("PLC"), and it may be integrated into the Human Machine Interface ("HMI").

With respect to the rewind module 110A, the rewind module may give the system the ability to clean or modify the web surface after coating as a final processing step before the web is wound onto a rewind mandrel 112A. A plasma unit, an ion beam, or electron beam unit may be used to modify the web surface. Resistive or infra-red heaters may also be sued in combination to clean or degas some web materials.

The System 100A may be controlled by operators through the use of an integrated device control system. An input/output (I/O) control computer may compute information related to each of the modules including separate information for each piece of process equipment, various temperature, pressure and gas sensors, and switches associated with the system. This I/O computer may be a PLC. The PLC may communicate to another computing device.

For example, in embodiments, System 100A may have a personal computer (PC)-based control system with distributed I/O. Software may be used to save and archive key system operation data such as chamber pressure, foreline pressure, heater temperatures, power supply powers, water flow rates. Software may be used for archiving data. In embodiments, this software may be Microsoft Excel or Microsoft Access.

The control computer and I/O may be housed in easily assessable 19-inch standard racks. A graphical user interface ("GUI") may be provided to interface with process equipment in order to facilitate the control of some or all of the processing operations. Password protection may be utilized to control access to the various functionality of the GUI described below.

In an embodiment, the GUI may allow a user of the System 100A to control the translation of the web 104A through the System 100A and its processing. The GUI may indicate control parameters, and it may allow the user to control such parameters as speed of the web 104A, tension of the web 104A, distance elapsed, distance remaining, time elapsed, time remaining, and other particulars related to the processing in each module. The user interface may provide real time control of system I/O with update times of less than 200 milliseconds.

The GUI may provide a well-designed, intuitive interface that displays key processing information. This may include:

a navigation screen, a vacuum set-up screen, a water flow rate set-up screen, a web motion set-up screen, a processing set-up screen, an alarms screen, and a complete I/O status screen.

A main screen may display the following information: a chamber schematic screen with color coding to indicate the status of process equipment and devices including: heaters, cathodes, mass flow controllers, valves, pumps, drums, radiant heat rollers, idler rollers, camel humps, and sensors, and web motion. The GUI may also replicate a push button to choose automated, manual, or maintenance modes. The GUI may also display cathode labeling information; chamber pressure; mass flow controller set point and actual value; conductance valve set point and actual pressure; cathode set points and actual power information, e.g., power, voltage, DC current, forward power, reflected power, and DC bias for RF. A running sequence screen may display the sequence of operations with the past and pending steps in red and the current step in green. The GUI may also display a current web position, a web remaining position, an elapsed time, and a time remaining, an alarm indicator, and GUI push buttons to access water flow rates.

A navigation screen may have the following: a push button to access a water set point screen; a push button to access a vacuum set point screen; a push button to access a cathodes location set-up screen; a push button to enable the maintenance mode.

A vacuum set-up screen may display the following: an mp on foreline open delay; a foreline pressure set point; a post foreline valve close delay; a rough chamber pressure set point—cross-over pressure; a foreline leak set point; rough pressure leak time; a rough leak check set point; a low foreline pressure set point; and a process start pressure. A foreline may be the process piping from the high vacuum pump to a backing pump. The backing pump may be a mechanical pump.

A water or fluid set-up screen may allow the user to set up flow rate set points for one or more of the following fluid delivery control systems: cathodes, turbo pumps, chambers, modules, mechanical pumps, cathode mounting plates, and quartz crystal mircobalances (QCM). For example, information regarding to water flow to a cathode may be displayed. Water flow to a cathode may be displayed, and it may be compared to a low flow set point. A low flow flag for alarming and interlocks may be designed. The low flow set point may be configurable from a set-up screen.

A web set-up screen may provide the following functionality: display system mode, e.g., pre-deposition, deposition, and post-deposition; set web speed; set processing length for pre-deposition, deposition, and post-deposition modes; monitor and alter web tension; save a recipe; call a recipe; and display recipes. A recipe may be a group of software routines that are executed in series or parallel controlling all sub-systems of the entire deposition.

A process set-up screen may provide the following functionality: enable or select the cathodes that are displayed on the GUI, display and adjust a gas flow set point, display or adjust the exhaust valve controller or working gas set point, call a recipe, and display a recipe.

Hyper links, tabs, or similar elements displayed on the GUI for accessing and displaying other control screens may be provided to facilitate easy navigation within the control interface.

Automatic modes may be enabled from the GUI. This may facilitate process controls that step through a predetermined sequence of events. These events may relate to the control of process equipment and sensors. Processes with automatic modes may include pumping, leak-checking, processing, and venting. Initiation of an entire preprogrammed process may be facilitated by the use of a single user input. Manual mode may be enabled to allow a user to manually control process equipment or sensors.

Automated pumping may include the automated pumping down of a system. This may include executing sequence of events such as enabling cooling water to cathodes, turbo, water pump and chamber jacket; closing high vacuum valves and verifying limit switches have been met, starting mechanical pump; delaying for a predetermined amount of time; starting a turbo pump; waiting until the turbo pump speed has reached 80% of set point; closing vent valve and verifying it has been closed; opening roughing valve if necessary; waiting for chamber pressure to drop below a roughing chamber pressure set point; closing the roughing valve; waiting a predetermined amount of time; comparing the chamber pressure to a predetermined pressure set point; alarming and exiting sequence if change in pressure is greater than a set point; opening valves; delaying a predetermined time such as 5 seconds; opening an isolation valve; waiting for a chamber pressure to drop below a set point; and exiting the sequence.

Automated leak-checking may include an automated leak-check sequence. This sequence may include verifying whether a chamber is at or below the set point; close a high vacuum valve; delay a leak check time set point; alarm an exit auto leak-check sequence if chamber pressure change is greater than a set point, open a high vacuum valve; and end sequence.

Automated processing may include an automated process sequence. This may allow for automatic control of the process components of the machine. Process control set points may be entered into the control set-up screen. This sequence may include waiting until chamber pressure is below a set point; enabling a cathode cooling water; start a web translation and processing sequence; obtaining web set-up parameters; enable and verifying gas flows; enable and verifying the exhaust valve control; enable power supplies to cathodes; enabling heaters, waiting for process to complete or alarm, initiating shutdown, turning of cathodes, turning of heaters; opening exhaust to conduction valve; stopping working gas flow; and ending automated process.

Automated venting may include an automated venting sequence. An auto vent sequence may be implemented to control the valves and pumps in bringing chambers and modules to set pressures, including to atmosphere. These sequences may include: disabling cooling water to cathodes and chamber jacket; closing high vacuum valves, isolation valves roughing valves if open; turning off ion gauge; delaying for a number of seconds defined in a set point; opening vent valve; waiting for door switch to become open; closing vent valve; and ending auto vent process.

The GUI may provide information regarding power supplies. This may include deposition power supplies and radio frequency power supplies. This may include information regarding set points, currents, voltage, and power values.

Control of each power supply's on/off state or power level may either be manual or automatic depending on a machine mode. In embodiments, if automatic control is selected, during the automatic process sequence the power supplies will be started. In manual mode, operators may control the on/off status via operator interface screens. The output level may be ramped up to a set point over a 60-second time period. The logic also monitors all interlock conditions and disables the power supplies during fault conditions.

Certain triggers may interrupt the functioning of the cathode. This may include 3-phase alarms, emergency stops triggers, a low flow of water alarm to the cathode, a chamber pressure alarm, insufficient process gas flow, and stoppage or breakage of the web.

Additionally, the gas control for each machine may consist of the interlocks and the continuous control of each gas. The system may monitor the interlock conditions and shut down gas flow if required. Each gas flow can be enabled/disabled via operator controls. Certain triggers may interrupt the functioning of gas flow. These may include a 3-phase alarm and an emergency stop.

Heaters may be controlled through the GUI. Each device, process equipment, and/or module may utilize independent temperature controllers to maintain temperature. The temperature may be retransmitted from the controller for display on the software. Certain triggers may interrupt the functioning of heaters. These include 3-phase alarm, emergency stops, temperature at a location being over or below predetermined thresholds, chamber or module pressure being too high, the web stopping or the web breaking.

A GUI may accept and scale all the systems pressure inputs including the roughing foreline, turbo foreline, process, and chamber pressure gages. It may also accept the atmosphere switch that is used for indication only.

Mechanical pumps may be controlled via the GUI, and through a manual pushbutton control. The pumps may be controlled automatically via the auto pump-down. The pump run status may be used to interlock the roughing, foreline, and HiVac valves.

The turbo pump may be controlled in two modes, manual and automatic through the GUI. In manual, the pump may be controlled via manual pushbutton control from the screen. In automatic, the pump may be started via the auto pump-down routine. The pump running status may be used to interlock the HiVac Valve. Alarms may trigger when there is a low turbo water flow, or where the pump is below 80% of the set point speed. Certain triggers may cause the turbo pump to shut down. These include a 3-phase alarm, an emergency stop, or a low turbo water flow.

The GUI may allow the water pump to be controlled in two modes, manual and automatic. In manual, the pump may be controlled via manual pushbutton control from the screen. In automatic, the pump may be started and stopped via the auto pump-down routine. The pump running status may be used to interlock the HiVac Valve. The heat output may be currently not used and will be deleted if unnecessary. The water pump cooling water may be input, scaled to GPM and compared to a low flow set point to set a low flow alarm and interlock. The low flow set point may be configurable from the GUI. The turbo cooling water may be input, scaled to GPM and compared to a low flow set point to set a low flow alarm and interlock. The low flow set point may be configurable from the screen. Certain events may trigger alarms, such as the pump not running or running. Certain triggers may cause the water pump to shut down, such as a 3-phase alarm, and emergency stop alarm, and a low water flow alarm.

The GUI may allow the roughing valve to be operated in two modes, manual and automatic. In manual, the valve may be controlled via operator interface pushbuttons. In automatic, the valve may be opened and closed via the auto pump-down and auto vent routine. In either mode, the valve may be subject to the interlocks. The valve may be forced to close if there is a 3-phase alarm, an emergency stop, a machine pump off, a pneumatic low pressure, a chamber low process or a chamber door open. The valve may be forced open if the vent valve is open, if the foreline valve is open or the high vacuum valve is open.

The GUI may allow for the high vacuum valve to be controlled in two modes, manual and automatic. In manual, the valve is controlled via manual pushbutton control from the screen. In automatic, the valve may be opened and closed via the auto pump down and auto vent routine. In either mode, the valve may be subject to the interlocks. Certain triggers may cause the valve to force close or may prevent the valve from opening. These include a 3-Phase Alarm, a emergency stop, the turbo pump being off, the mechanical pump being off, the pneumatic low pressure alarm being present, the chamber door being open, the chamber low pressure set point not being met, the foreline high pressure flag being set, the vent valve being open, the roughing valve being open, the foreline valve being closed.

The GUI may allow for the vent valve to be controlled in two modes, manual and automatic. In manual, the pump is controlled via manual pushbutton control from the screen. In automatic, the valve is open and closed via the auto pump-down and auto vent routine. In either mode, the valve is subject to the interlocks.

Software may be utilized to perform logic to generate alarms and input I/O as alarms. Emergency mode will shut down the system. Software may be implemented to recognize impending emergencies. This may allow user intervention to try to correct the problem before complete system shut down. Alternatively, the alarm mode may just display the alarm state if the issue is not critical.

The System's electrical power may operate from a single-source 480 volt, 3 phase, 5 wire (3 primary phases, neutral, and ground) facility power. In embodiments, wire distribution within control cabinets are sized and fused according to component vendor specifications. The electrical system associated with System 100A may have a single point breaker and/or fuse disconnect, with interchangeable maximum current ratings. The main electrical disconnect may remove power from the entire system with the exception of items powered by an uninterruptable power supply. An uninterruptable power supply (UPS) may supply power to a control computer. This power supply may last ~20 minutes.

The electrical system may contain all necessary transformers, circuit breakers, relays, contractors, motor starters, and fuses necessary to allow complete system operation from the control panel. It may additionally include sufficient regulation of power fluctuations to ensure satisfactory operation under conditions of over/under-voltage variations of up to +10% in the form of either a fast immediate or gradual change.

In embodiments, the electrical system equipment and enclosures comply with applicable National Electrical Code (NEC) and National Electrical Manufacturer's Association (NEMA) standards for a normal industrial environment. In embodiments, the control panels are rated to NEMA 1. The electrical systems may be capable of operation without exposing personnel to dangerous electrical potentials. Wire numbers may be attached to each wire near each terminal point, using a clear and permanent marking method. The wire numbers may coincide with the numbers shown on the point-to-point and detailed wiring diagrams. Shielded terminal strips may be used for wiring which is 120 volts or greater when measured to ground or neutral. The electrical system may have a three-phase monitor, interfaced to the system I/O to provide and alarm state if all three phase are not active. Electrical components such as breakers and magnetic contactors may be aligned in a vertical fashion, mounted on DIN rails. Wires between interconnect, close proximity power components (i.e., fuse-to-breaker-magnetic contactor-SCR) may be clearly labeled and visible. Wire numbers may be attached to each wire near each terminal point, using a clear and permanent marking method. The wire numbers coincide with the numbers shown on the point-to-point and detailed wiring diagrams.

The system may provide a single point water supply and return, power, and dried compressed air to the system. Water and gas distribution systems may be connected to the System 100A.

A chilled water utility subsystem may be connected to the System 100A. In embodiments, this may have a single point supply and return. Independent shut off valves for each item requiring cooling may be present. The incoming water may be regulated from 30 to 65 psi. Water distribution components may be designed to withstand water pressures from 30 to 65 and up to 100 psi range. Incoming water temperature may be regulated from 55 to 70 deg F. System 100A may provide means to regulate water flow rate to each component. In embodiments, the system may provide regulated chill water flow circuits and regulated heated water circuits.

In embodiments, chilled water may be used for certain systems. For example, cathodes may require 15 gallons per minute (GPM) of chilled water. Chambers may require 5 GPM, turbo pumps may require 0.5 to 1 gpm, and water vapor pumps may require 0.5 to 2 GPM. In embodiments, the total system flow may require 20 GPM of chilled water.

Temperature, pressure, and flow rate sensors may be used on all water inlet and outlet lines. Valve actuators for compressed air blow down of the water system for maintenance of water containing components may be utilized.

A dry compressed air subsystem may be connected to System 100A. In embodiments, a single air line may be used with System 100A. Incoming air maybe provided at 100 to 120 psi. System components may be designed to withstand maximum incoming air pressure. Additionally, a valve manifold may be provided for purposes of actuating pneumatic valves. Lockout/tagout air pressures regulators and filters may be provided. Air pressure regulators may be properly sized for valves in use in connection to the System 100A.

An alternative embodiment of the System may be seen in FIG. 1B. The System 100B is an example of a modular design comprised of an unwind module 102B, a deposition back-side deposition module 104B, a front-side deposition module 106B, a first differential pumped isolation module 108B, a thermal evaporation module 110B, a second differential pumped isolation module 112B, an in-situ coating diagnostics module 114B, and a rewind module 116B. The eight modules are shown separated for illustration purposes, however, in a standard embodiment the modules may be connected so that the web is not exposed to the external environment as it passes through the different environments of each module. The system 100B may include GUI's, electrical power systems, integrated device control systems, computer systems, chilled water systems, and temperature and pressure flow rate sensors as described with reference to system 100 above.

In embodiments, the unwind module 102B may be configured to clean or prepare the web surface prior to coating. Cleaning unit 119B may be used to clean or prepare the web.

In embodiments, the unwind module 102B may be configured to unwind a web 120B as the web translates through the system 100B. For example, the unwind module 102B may have a mandrel 118B on which the web 118B may be spooled or a removable spool may be attached. For example, a fully spooled mandrel may have a 20" O.D. with a 6" core by 1.2 meter wide, and the fully spooled web may be 1500 lbs. The System 100B may include elements that shield roller bearings from deposition. The mandrel may be shielded to prevent deposition of sputtered material.

A pump 124B may regulate the pressure in the unwind chamber 102B. Pump 124B may be used in other modules as well. A single pump may be used for each module or chamber. Alternatively, all modules may be controlled by a single pump connected to a pumping manifold. Additionally, pumping configurations as described with respect to FIG. 7 may be employed. In embodiments pump 124B may be a variable speed pump. Other pump types may be used. A roughing pump may be employed at early stages to achieve very low pressures within the system. Working pressure may be controlled by adjusting the exhaust. Working pressure may also be controlled by adjusting the pumping rate or inlet valve opening.

The pump 124B may be attached to pump piping. Pump piping may be welded 304 or 316L stainless steel or any suitable material. Vacuum pump piping may use various types of flanges in order to facilitate rapid removal of the flanges. These flanges may be KF ISO style flanges. Less frequently removed flanges may be conflate style flanges.

In embodiments, the unwind module 102B contains an idler roller 122B. The idler roller 122B may guide the web 120B through the unwind module. Idler rollers may also be used in other modules. Idler rollers may be designed for removal for periodic cleaning. In embodiments, the idler roller surface roughness may be 8 microinch rms. Idler rollers may spin freely, and they may have low rotational inertia. Idler rollers may be shielded to prevent deposition of sputtered material. Idler rollers may have active sensors to indicate positive motion.

The web 120B may translate through a back-side deposition chamber 104B. The web 120B may be routed through the back-side deposition module 104B so that the back-side of the web 120B faces a processing device 125B. The module 104B is shown with six idler rollers 124B for receiving and directing the web 120B onto a drum 126B and through the module so that the back side of the web is exposed to two processing devices 125B, e.g., sputtering devices.

The web 120B continues through the system from the back-side deposition module 104B to the front-side deposition module 106B. The translation of the web 104 through the front-side deposition module 106B occurs in such a way that the front-side of the web substrate is exposed to the output of two process modules 125B. Both the back-side deposition module 104B and the front-side deposition module 106B may include one or more of the following: a drum, an idler roller, a camel hump, a radiant roller, a free span, an additional transport device or assembly, and any processing devices such as a deposition source, a heater, a laser or an optical device, a process monitor or process sensors, etc., as necessary for the desired final product.

In embodiments of the System 100B, deposition techniques utilized may include ion-beam, ion-assisted, high-target-utilization reactive sputtering, high-power impulse magnetron, gas flow sputtering or any deposition technology now known or later developed. A web 120B passing in proximity to a sputtering cathode and target plate may cause material to be deposited onto the side exposed to the plate.

Cathodes may be employed in the back-side deposition module 104B and the front-side deposition module 106B. Power to the cathode may be supplied by radio frequency ("RF"). RF power supplies may have capability for phase locking to avoid RF cross-talk by using one power supply as the master and by disabling the RF signal generator in the remaining power supplies. Cooling and maintenance of cathodes may be performed in a similar fashion as described with respect to FIG. 1A.

A drum, idler roller, camel hump or radiant roller may be used to heat or cool the web 120B. In embodiments of the System, any drum, idler roller, camel hump (as described in greater detail above) or radiant roller may be temperature controlled independent of the temperature of the gas environment in the interior space of the modules. This temperature control of components that physically contact the web may include the use of radio frequency, alternating current, or pulsed direct current. Additionally, plasma may be used to add energy to the System where needed. The use of magnetics in the localized drum, idler roller, camel hump or radiant roller may be used to increase the sputtered species ionization fraction and surface energy in the web. The temperature control may use a programmable logic controller ("PLC"), and it may be integrated into the Human Machine Interface ("HMI").

Turning now to the first differential pumped isolation module 108B, the web 120B may pass through a differential pumped isolation module 108B. A vacuum pump 124B may be used to keep the differential pumped isolation module at a set pressure. In embodiments, this pressure may be lower than that of modules that are mechanically coupled to the differential pumped isolation module. The differential pumped isolation module 108B may be coupled to a front-side deposition module 106B and a thermal evaporation chamber 110B. The front-side deposition module 106B may be at a higher pressure than the differential pumped isolation module 108B. In addition, thermal evaporation module 110B may be at a higher pressure than the differential pumped isolation module 108B. This may cause process gasses associated with a module mechanically coupled to the differential pumped isolation module 108B to flow into the differential pumped isolation module 108B. As such, process gasses will not flow from the differential pumped isolation module 108B into modules mechanically coupled to the differential pumped isolation module 108B. This may preserve the partial pressure set-points for mechanically coupled modules, such as front-side deposition module 106B and thermal evaporation module 110B.

Next, the web 120B may translate through a thermal evaporation module 110B. The thermal evaporator module 110B may contain thermal evaporator process equipment 132B. This process equipment may employ a thermal method, a crucible method, a molecular beam epitaxy method, an electron beam method, a flash evaporation method, or a resistive evaporation method to facilitate evaporation of a source material. This may cause the source material to evaporate and be deposited on the web 120B. Two idler rollers 122B may be present to guide the web through the thermal evaporation module 110B. Process device 130B may aid in the process associated with evaporation module 110B.

The web may then translate through a second differential pumped isolation module 112B. A vacuum pump 124B may be used to keep the differential pumped isolation module at a set pressure. In embodiments, this pressure may be lower than that of modules that are mechanically coupled to the differential pumped isolation module. The differential pumped isolation module 112B may be a thermal evaporation chamber 110B and an in-situ coating diagnostics module 114B. The thermal evaporation chamber 110B may be at a higher pressure than the differential pumped isolation module 108B. In addition, in-situ coating diagnostics module 114B may be at a higher pressure than the differential pumped isolation module 108B. This may cause process gasses associated with a module mechanically coupled to the second differential pumped isolation module 112B to flow into the second differential pumped isolation module 112B. As such, process gasses will not flow from the second differential pumped isolation module 112B into modules mechanically coupled to the second differential pumped isolation module 112B. This may preserve the partial pressure set-points for adjacent modules, such as front-side deposition module 106B and thermal evaporation module 110B.

Next, the web 120B may translate through an in-situ coating diagnostics module 114B. The in-situ diagnostics module may contain process equipment that may perform thermal wave analysis, optical emission spectroscopy, and x-ray photoelectron spectroscopy. Multiple diagnostic devices such as 134B and 136B may be present in module 120B.

With respect to the rewind module 116B, the rewind module may give the system the ability to clean or modify the web surface after coating as a final processing step before the web is wound onto a rewind mandrel 140. A final processing device 138 may facilitate cleaning.

Figure 2:
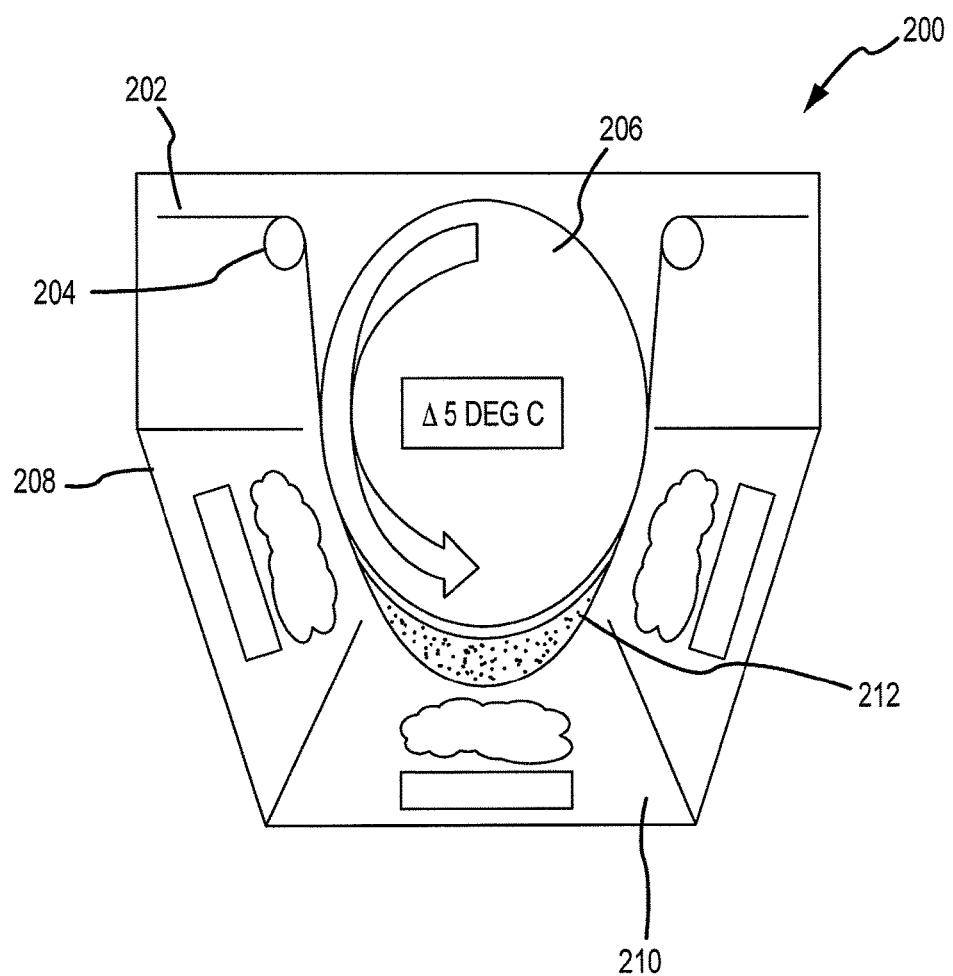
FIG. 2 illustrates an embodiment of a multiple-chamber deposition module with a camel hump.

FIG. 2 illustrates an embodiment of a multiple-chamber deposition module with a drum and a device on the drum referred to herein as a "camel hump." In the embodiment shown, the web 202 enters the multiple-chamber deposition module 200. An idler roller 204 may guide the web substrate along a drum 206. The drum 206 may be temperature controlled to a first temperature. This temperature control may include the use of radio frequency, alternating current, heated or cooled fluid, or pulsed direct current. In the embodiment shown, the camel hump 212 is a device placed adjacent to the drum such that as the drum rotates, the web lifts off from the drum, travels over a web-contact surface of the camel hump, and then returns to the drum.

Embodiments of the deposition module 200 may have multiple chambers, such as the three process chambers 208, 210 and 214 as shown in FIG. 2. The web 202 may enter a first deposition chamber 208. The first deposition chamber 208 may have a temperature control process and pressure control process. The temperature in the first deposition chamber 208 may be maintained at a temperature of the drum 206 or near a temperature of the drum 206. Entering the deposition chamber 208 may cause the temperature of the web 202 to approach the temperature of the drum 206. The web 202 may leave the first deposition chamber 208 having had material deposited on it through a deposition process. Processing devices other than deposition devices may be used.

In embodiments, the web 202 may enter another chamber of the multiple-chamber deposition module 200. This chamber may be a second deposition chamber 210 provided with a camel hump 212. In embodiments, this camel hump-equipped deposition chamber 210 may have a different temperature and pressure profile than the first deposition chamber 208 and the drum 206. The drum 206 may be designed to engage the web. The camel hump 212 facilitates the different temperature by causing the web 202 to contact the camel hump and not the drum while in the second deposition chamber 210. The camel hump may be provided with its own temperature control so that, as the web 202 contacts the camel hump, the web's temperature is changed toward that of the camel hump. In embodiments, the drum 206 may be a low temperature (Δ5 deg. C. is shown in FIG. 2) and the camel hump 212 may allow for the web 202 to have its temperature increased dramatically while in the second deposition chamber 210. An opposite configuration is also possible, where the camel hump is held at a temperature lower than the drum. Greater or lower temperature differences between the drum and the camel hump may also be possible.

In the embodiment shown, the camel hump 212 causes the web 202 to be separated from the drum 206 for some distance. The distance may be fixed. Providing a camel hump in a separate chamber allows for the localized control of physical and chemical conditions within that chamber. For example, this may allow for localized high or low temperature in-situ process temperature control. This may be facilitated by the camel hump 212 having internal cooling elements and heating elements to control the temperature of the surface of the camel hump. In a further embodiment, these heating and cooling elements may be used in combination to create a specific temperature gradient across the camel hump 212. Additionally, magnetic fields, radio frequency, alternating current, and/or pulsed DC power may be applied to some or all portions of the camel hump 212.

In the embodiment shown, the camel hump 212 has two surfaces: a drum-facing surface that complements the curvature of the adjacent drum and a web-contact surface over which the web travels. The web-contact surface may be treated to prevent damage to the web-surface and any coatings that may be on the web surface that is in contact with the web-contact surface. The web-contact surface may have any shape depending on the needs of the design. For example, the web-contact surface may be a continuous curve as illustrated in FIG. 2, may include a substantially flat section adjacent to the sputtering device or process device, or may be provided with multiple planes or different surfaces as needed. The web-facing surface may be designed to engage the web. The drum-facing surface may be spaced by some nominal amount to prevent the temperature of the drum from interfering with the operation of the camel hump 212. In an embodiment, the drum-facing surface may include or be made entirely of an insulating material such as a ceramic in order to more effectively thermally isolate the camel hump's web-contact surface from the drum. The camel hump may contain resistive heating elements and/or thermal transfer fluids in combination with a heater or chiller unit. The camel hump may also have a particular material specification of the camel hump and specialized coatings for camel hump and web interface. Temperature control of the hump 212 may be controlled by a control system. This control system may be configured to control the temperature of the web-surface. Though one camel hump is shown in FIG. 2, multiple camel humps may be utilized. Each camel hump may have its own control system or be independently controlled from a central control system.

Though FIG. 2 depicts a multiple-chamber deposition module 200 having three chambers, the multiple-chamber deposition module may have as little as one chamber, and it may have more than three chambers. The multiple-chamber deposition module may have a drum, or it may not. The chamber types may include one or more of the following chambers: a deposition chamber, a camel hump chamber, a free span chamber, and a radiant roller chamber. Chamber components may be designed to optimize uniform process gas flow across the deposition source and process space.

Figure 3:
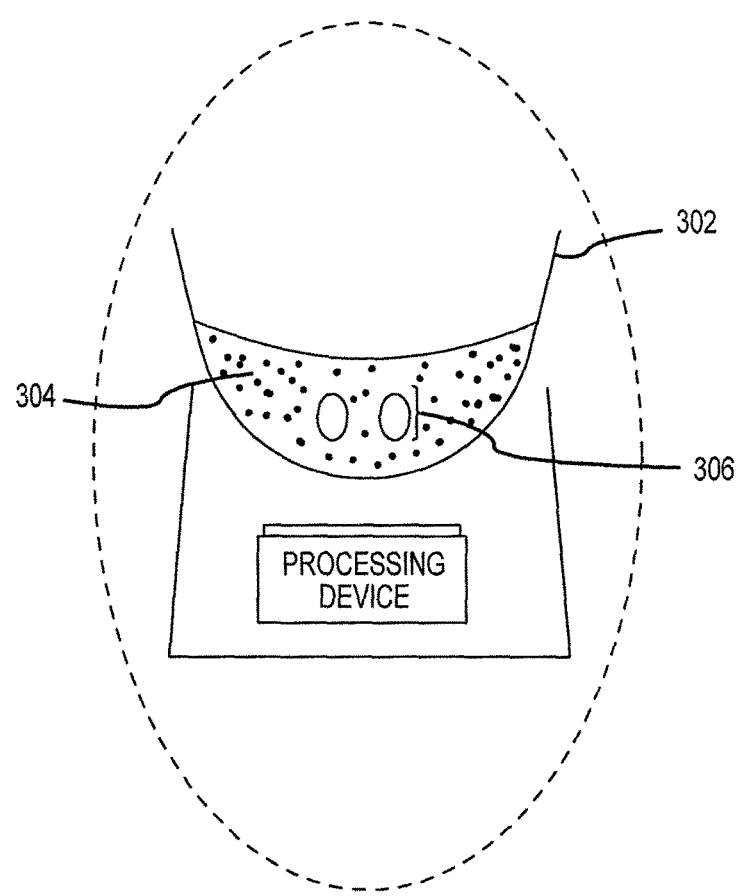
FIG. 3 illustrates an embodiment of elements of a free span chamber.

For example, FIG. 3 illustrates an embodiment of elements of a free span chamber. In embodiments, the web 302 passes over a camel hump 304 that is not adjacent to a drum. This camel hump may have heating and cooling elements 306. A drum may not be present in the free span chamber.

Figure 4:
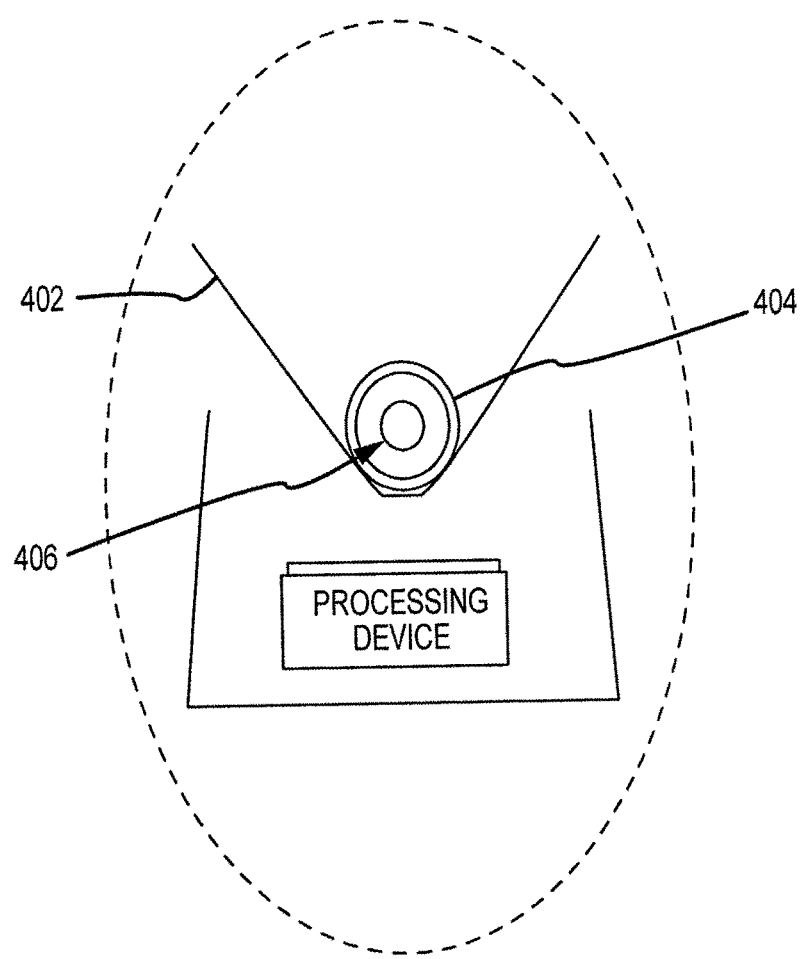
FIG. 4 illustrates an embodiment of elements of a radiant roller chamber.

FIG. 4 illustrates elements of a radiant roller chamber. The web 402 passes over the radiant roller 404. The radiant roller may have internal heating and cooling elements 406. These elements may be used to control the temperature of the radiant roller. Temperature of the radiant roll heater may be controlled through the use of radio frequency, alternating current, or pulsed direct current. Additionally, plasma may be used to add energy to the system.

Figure 5:
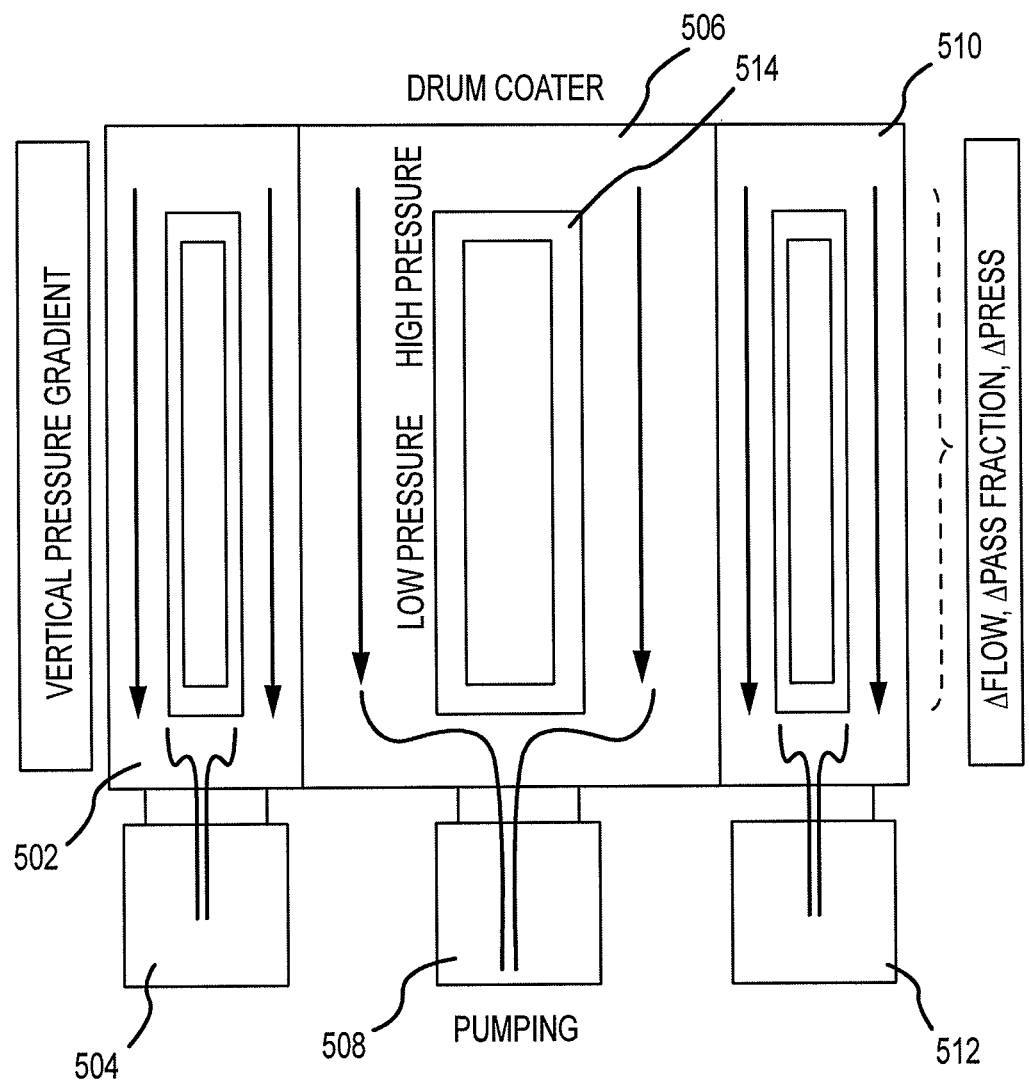
FIG. 5 illustrates an embodiment of a pumping scheme.

FIG. 5 presents an embodiment for a pumping scheme for modules in the System 100. In embodiments, a module may have three chambers. Gas flow of a first chamber 502 may be controlled by a pump 504. Gas flow of a second chamber 506 may be controlled by a second pump 508. Gas flow of a third chamber 510 may be controlled by a third pump 512. A deposition cathode 514 may be present in the chamber.

Each chamber 502, 506, and 508 may be provided with a process gas transport system that is attached to one or more pumps, which may be shared between chambers or may be completely independent. The process gas transport system may be provided with different assemblies for removing and/or injecting process gas as is known in the art. Such transport systems may include pressure sensors, gas analyzers and flow meters for monitoring and controlling the process gas in the chambers. They may also include valves such as check valves, flow control valves and various piping and other transport structures for directing and conveying flow of process gas.

Gas flow in first chamber 502 travels vertically toward the pump 504. The gas may pass through a single orifice located at the coupling between the first chamber 502 and the inlet of the pump 504. Pump piping may include a vacuum tight welded 304 or 316L stainless steel. Similarly, gas flow in a second chamber 506 may flow vertically through a single orifice located at the coupling between the second chamber 506 and the pump 508. Additionally, gas flow in third chamber 508 may flow vertically through a single orifice located at the coupling between the third chamber 510 and the pump 512. The gas used in this process may be an inert gas such as argon. Pumps and pump piping may be similar to the pumps and piping as discussed with reference to FIG. 1A.

Figure 6A:
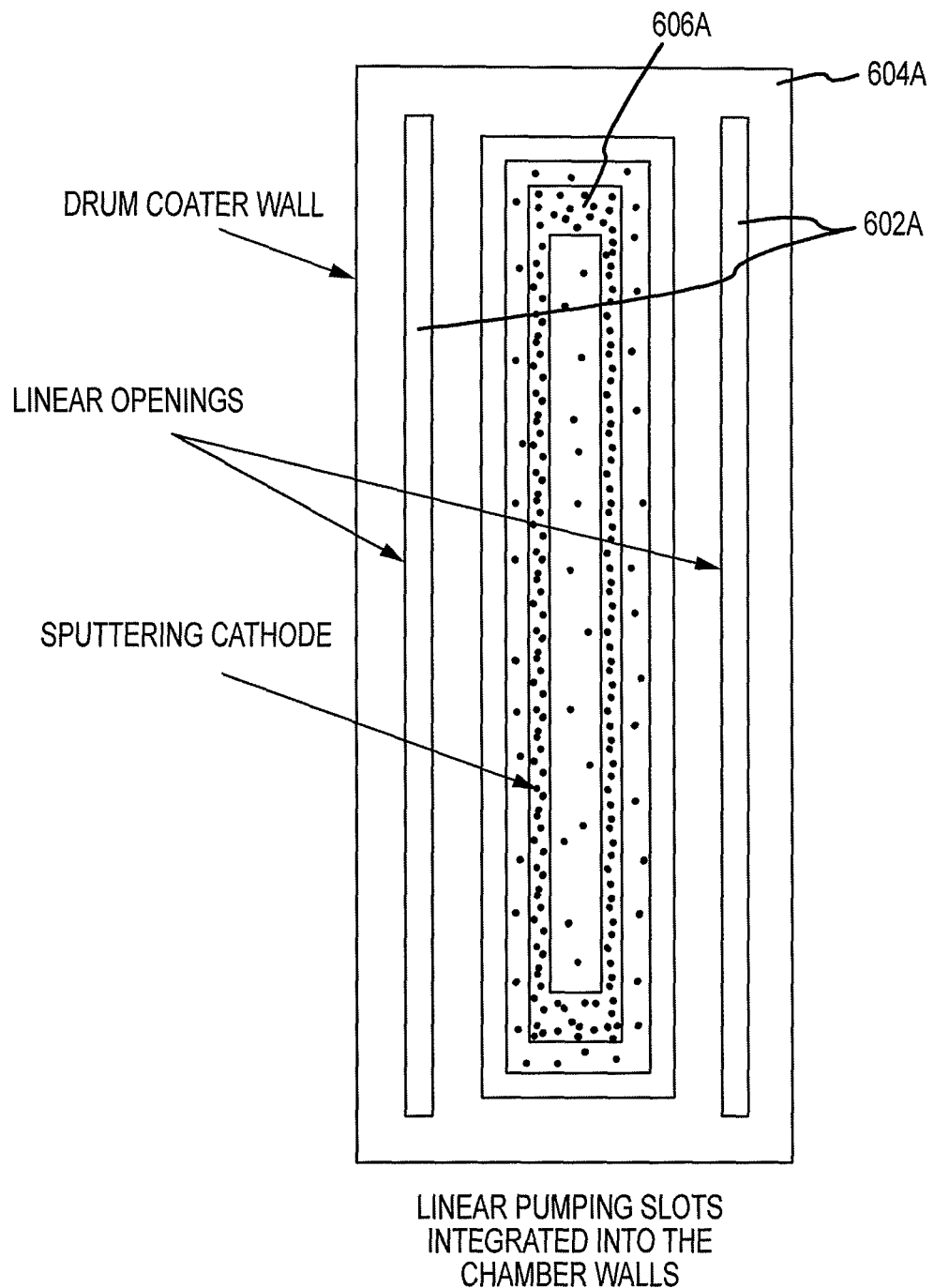
FIG. 6A illustrates an embodiment of an open slit chamber wall of a module.

FIG. 6A presents an embodiment of an open slit chamber wall of a module. Open volume slits 602A line the chamber wall 604A. The open slit 602A may allow process gas to be pumped into the chamber. This may allow for a more vertically homogenous pressure differential across the chamber. The chamber wall 604A may be made out of stainless steel 304 or 304L. A deposition cathode 606A may be present. Other processing devices may also be present. The open slit 602A may be a single open slit. In alternative embodiments the open slit may be a series of perforated holes, slits, or other openings that allow process gas to flow into the chamber. These may form essentially a vertical line, but other shapes such as s-curves, circles, intermittent vertical openings, or others may be desirable. A horizontal configuration may also be desirable in some applications.

Figure 6B:
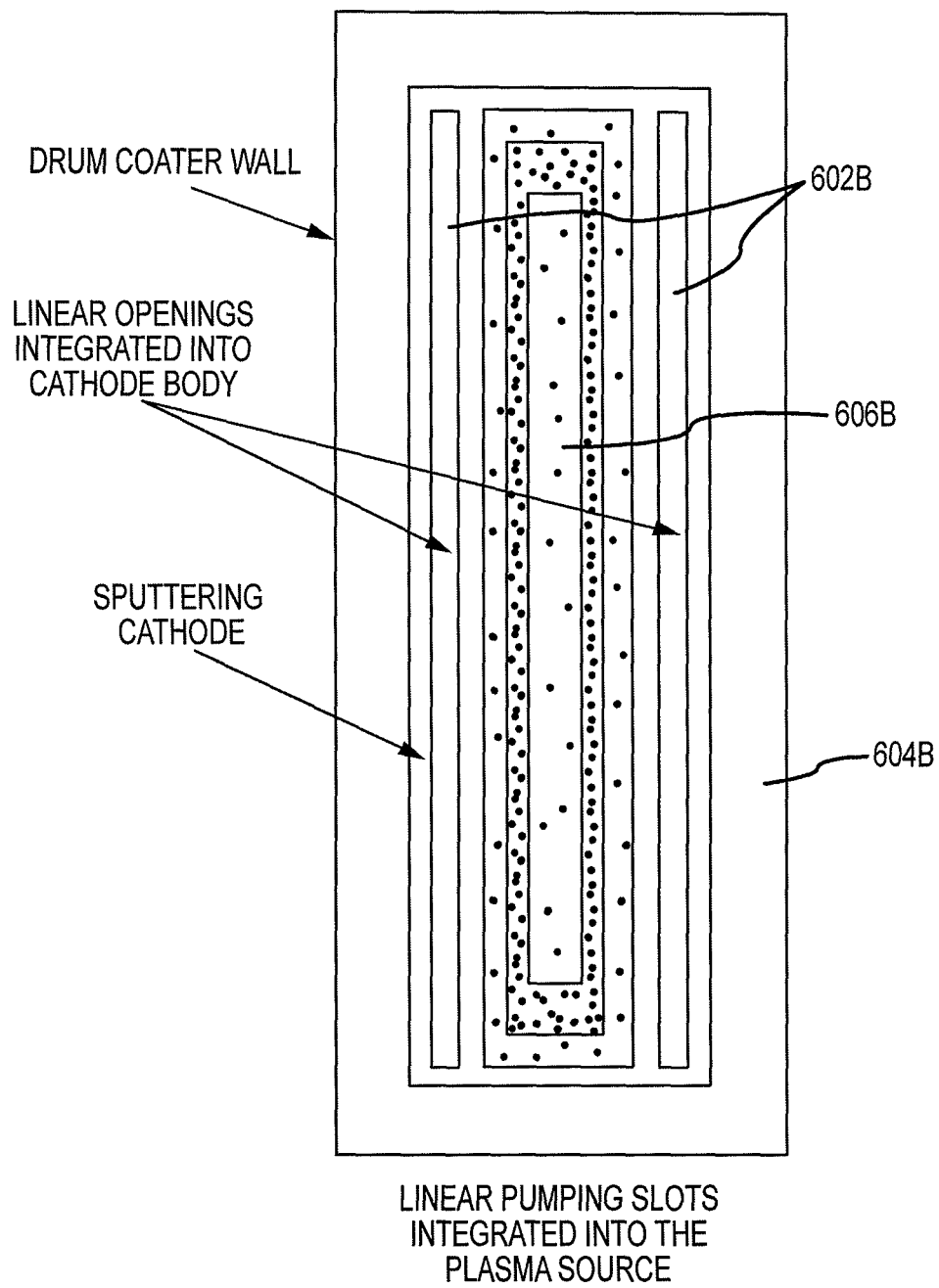
FIG. 6B illustrates an alternative embodiment of an open slit chamber wall of a module.

FIG. 6B presents an alternative embodiment of an open slit chamber wall of a module. Integrated open volume slits 602B are integrated into the body of deposition cathode 606B. The open slit 602B may allow process gas to be pumped into the chamber in a uniform manner. This may allow for a more vertically homogenous pressure differential across the chamber. The chamber wall 604B may be made out of stainless steel 304 or 304L. The open slit 602B may be a single open slit. In alternative embodiment the open slit may be a series of perforated holes, slits, or other openings that allow process gas to flow into the chamber. These may form essentially a vertical line, but other shapes such as s-curves, circles, intermittent vertical openings, or others may be desirable. A horizontal configuration may also be desirable in some applications.

Figure 7:
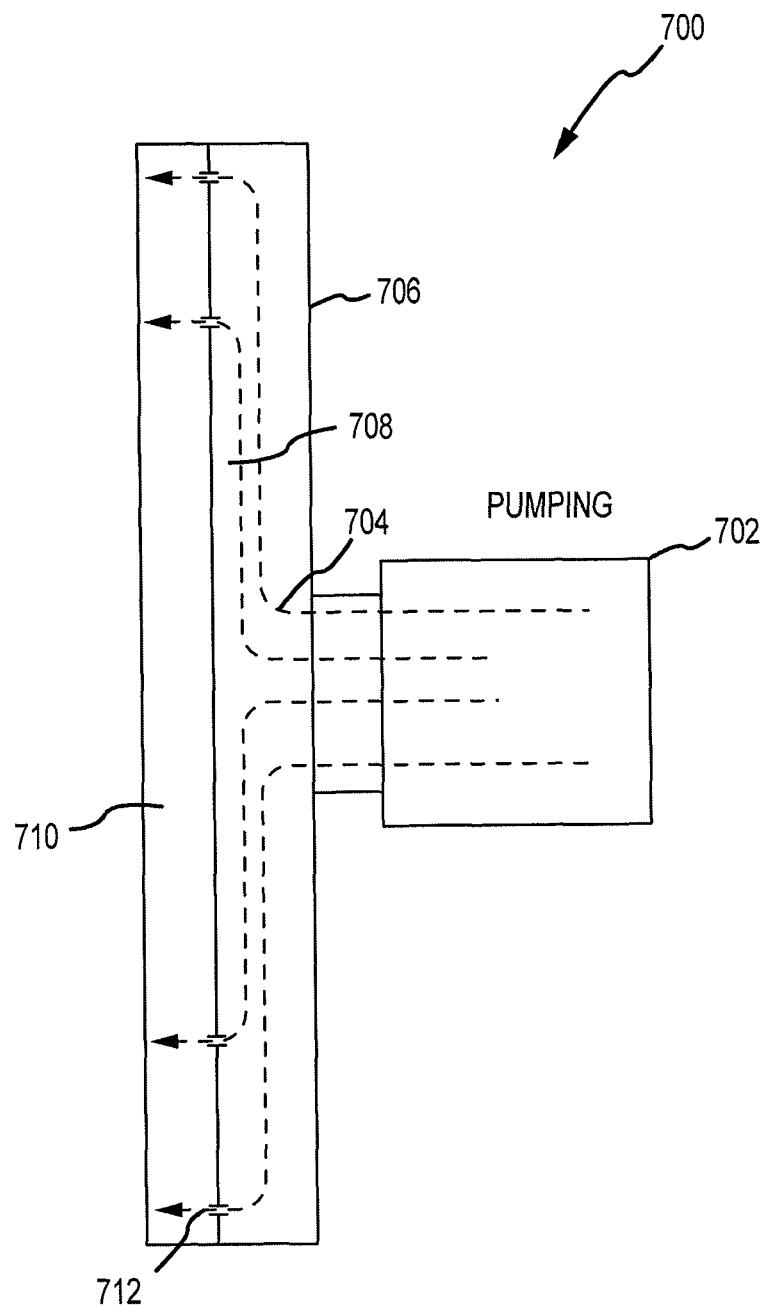
FIG. 7 illustrates an integrated linear inter-cell and background pumping configuration.

FIG. 7 illustrates an embodiment of an integrated linear inter-cell and background pumping configuration 700. The integrated linear inter-cell and background pumping configuration chamber may control the gas flow into and out of a chamber. The pump configuration 700 may be used in combination with an open slit chamber wall module. The pump 702 may be centered along the chamber wall, and it may direct the gas into a module with one or more chambers. The fluid flow 704 may provide homogenous horizontal and vertical pressures. The pumping may be achieved using either an open volume or slits to develop the pressure or a plenum tapered to control streaming velocity in the vertical direction. An alternative pump configuration for integrated linear inter-cell and background pumping may have the pump positioned in an off-centered position. Exterior cell wall 706 may form an interstitial void with interior wall 708. Gas may be delivered by pump 702 into chamber 710 through slit 712.

Figure 8:
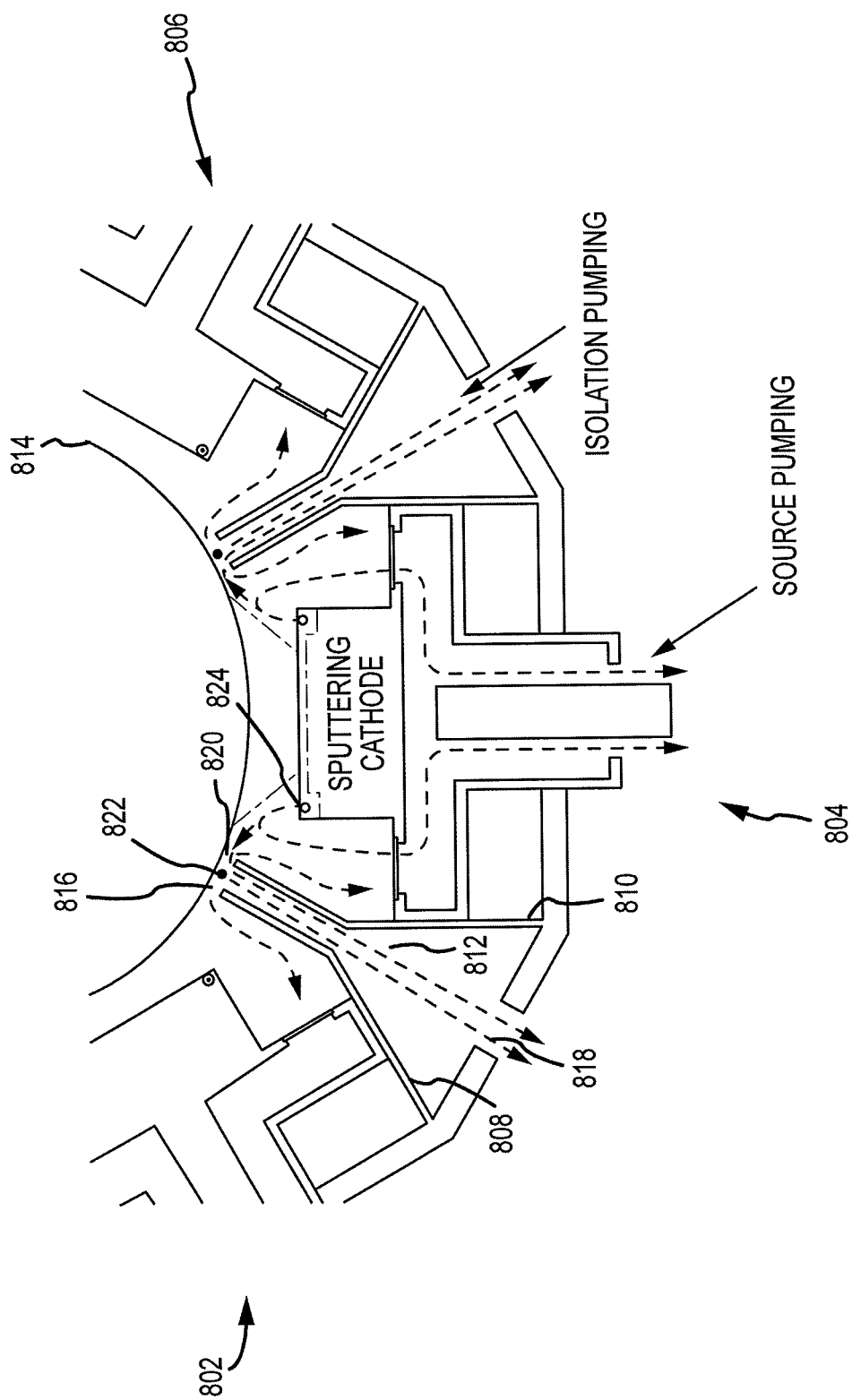
FIG. 8 illustrates an embodiment of a multiple-chamber gas curtain separation system.

FIG. 8 illustrates an embodiment of a multiple-chamber gas curtain separation system 800. In embodiments, a multiple-chamber gas curtain separation system may have a first process chamber 802, a second process chamber 804, and a third process chamber 806. The first process chamber 802 may have an interior first process barrier wall 808. The second process chamber 804 may have an interior second process barrier wall 810. The interior first process barrier wall 808 and the second process barrier wall 810 may be spaced apart to form an interstitial space 812. A web 814 may translate through the first process chamber 802 into the second process chamber 804. Barrier process walls may be made of stainless steel 304 or 304L.

In embodiments, it may be desirable to prevent process gasses from the first process chamber 802 from flowing into the second process chamber 804. It may also be desirable to direct the flow of process gases related to the first process chamber 802. There may be a first web-barrier wall gap 816 that may allow first process gasses to escape from the first process chamber 802. A flow of separation gas 818 may be supplied to the interstitial space 812. Flow of this separation gas 818 may travel the interstitial space, and the separation gas 818 may flow out through a gas removal system. This flow of separation gas 818 may entrain process gasses from the first process chamber 802. Differential pumping may draw the separation gases and the process chamber gases from the interstitial space 812 by means of a gas removal system as described above, essentially operating the chamber 802 under positive pressure relative to that of the interstitial space 812.

The flow of separation gas 818 may follow several paths. One such path may be through interstitial space 812 to a gas removal system. This gas removal system may be designed to remove the separation gas 818 and process gas out of the system. The flow of gas may not travel through a web processing chamber, such as first process chamber 802 or second process chamber 804.

A web processing chamber may be a chamber where a web is processed. This process may include one or more of the following processes: deposition, cleaning, waiting, settling, preparing, or another process necessary for processing the web. Any of the modules or chambers referenced in FIGS. 1-7 may include or be a web processing chamber.

Alternatively, the flow of separation gas 818 may take a different path. The flow may split. Some flow of the separation gas 818 may flow through an interstitial space 812 to a gas removal system. Flow of some of the separation gas 818 may pass through a web-barrier wall gap 820 to a second process chamber 804. The flow may then travel to a gas removal system that may be designed to remove separation gas 818 in such a way that causes the gas flow to pass through the web processing chamber.

Separation gas 818 may be gas supplied through a gas curtain injection port 822. A gas curtain injection port 822 may allow flow of separation gas 818 to flow through an interstitial space. In some embodiments, one or more gas injection ports 822 may be located proximate to the web 814, a first web-barrier wall gap 816, and a second web-barrier wall gap 818. Alternatively, the gas curtain injection port 822 may be located at a point within the interstitial space 812. Additionally, there may be multiple gas curtain injection ports located in or in proximity to the interstitial space 812 through which the curtain gas is injected into the interstitial space 812.

A control system may be employed with the gas separation system 800. This may monitor the pressure in the interstitial space. It may also monitor the pressure of web processing chambers, e.g., a first process chamber 802 and a second process chamber 804. This may control the operation of one or more of the gas removal systems, the curtain gas injection systems, and the process gas transport systems. Various sensors may be employed to monitor flow, temperature, and pressure. Additionally, sensors may be employed to monitor the gaseous make-up of the gas at various points in the process chamber and interstitial space. The control system may allow the regulation of the flow, pressure, and temperature by monitoring and altering pump speeds, valve openings, and cooling/heating elements.

The process gas may be provided by a process gas transport system 824. This process gas transport system 824 may supply a flow of process gas. The process gas transport system may be attached to a pumping manifold. Alternatively, it may be attached to a pumping system as described with reference to FIG. 6A, FIG. 6B and/or FIG. 7. Similarly, the gas curtain injection port 822 may supply a flow of separation gas. To supply the flow of separation gas, pumping manifolds or other pumping schemes such as those referenced in FIG. 6A, FIG. 6B, and/or FIG. 7 may be used. Separation gas may have a gas make-up similar to a process gas. It may also have another gaseous make-up such as air.

Additionally, in embodiments, it may be desirable to prevent process gasses from the second process chamber 804 from flowing into the first process chamber 802. It may also be desirable to direct the flow of the second process gases. There may be a second web-barrier wall gap 820 that may allow second process gasses to escape from the second process chamber 804. A flow of separation gas 818 may be supplied to the interstitial space 812. Flow of this separation gas 818 may travel the interstitial space, and the separation gas 818 may flow out through a gas removal system. This flow of separation gas 818 may entrain process gasses from the second process chamber 804. Differential pumping may draw the separation gases and the process chamber gases from the interstitial space 812 by means of a gas removal system as described above, essentially operating the chamber 804 under positive pressure relative to that of the interstitial space 812.

It will be clear that the present invention is well adapted to attain the ends and advantages mentioned as well as those inherent therein. Those skilled in the art will recognize that the methods and systems of the present invention within this specification may be implemented in many manners and as such is not to be limited by the foregoing exemplified embodiments and examples. In other words, functional elements being performed by a single or multiple components, in various combinations of hardware and software, and individual functions can be distributed among software applications at either the client or server level. In this regard, any number of the features of the different embodiments described herein may be combined into one single embodiment and alternate embodiments having fewer than or more than all of the features herein described are possible.

While various embodiments have been described for purposes of this disclosure, various changes and modifications may be made which are well within the scope of the present invention. Numerous other changes may be made which will readily suggest themselves to those skilled in the art and are considered within the scope of this disclosure.

What is claimed:

1. A system for processing a web comprising:
   a rotatable drum having an exterior drum surface adapted to engage a web;
   a camel hump adjacent to the rotatable drum, the camel hump including:
      a non-moving body having a drum-facing surface adjacent to the exterior drum surface, wherein the drum-facing surface is curvilinear to a curvature of the rotatable drum;
      a web contact surface spaced facing away from the exterior drum surface adapted so that a web on the rotating drum lifts off from the drum and travels across the web contact surface of the camel hump during drum rotation; and
      a heating element that is embedded within the structure of the camel hump;
   wherein a temperature of the rotatable drum is controlled independently from a temperature of the camel hump.

2. The system of claim 1 wherein the camel hump and the rotatable drum each include at least a resistive heating element, a thermal fluid transfer element, or a conductive transfer element.

3. The system of claim 1 wherein at least a portion of the camel hump is made of an insulating material and wherein the insulating material is located adjacent to the exterior drum surface to insulate the web contact surface of the camel hump from the exterior drum surface.

4. The system of claim 1 further comprising:
   a plurality of camel humps adjacent to the rotatable drum.

5. The system of claim 4 further comprising:
   a control system configured to independently control the temperature of each web contact surface of each of the plurality of camel humps.

6. The system of claim 4 wherein each of the plurality of camel humps is in a different web processing chamber performing a different web processing operation at least partially affected by the temperature of the web contact surface of the camel hump.

7. The system of claim 1 wherein the distance between the camel hump and the exterior drum surface is fixed.

8. The system of claim 1, wherein at least one of a magnetic field, a radio frequency, an alternating current, or a pulsed DC power is applied to the camel hump.

* * * * *